United States Patent [19]

Hall

[11] Patent Number: 5,055,705
[45] Date of Patent: Oct. 8, 1991

[54] SELECTING ONE OF A PLURALITY OF VOLTAGES WITHOUT OVERLAP

[75] Inventor: Christopher M. Hall, Redwood City, Calif.

[73] Assignee: National Semiconductor Corp., Santa Clara, Calif.

[21] Appl. No.: 481,355

[22] Filed: Feb. 15, 1990

[51] Int. Cl.⁵ ..................... H03K 5/00; H03K 17/56; H03K 5/22; H03K 19/007

[52] U.S. Cl. ............... 307/296.4; 307/296.5; 307/242; 307/364; 307/442; 328/116; 328/154; 361/86

[58] Field of Search ............... 307/510, 242, 272.1, 307/262, 296.5, 442, 364, 296.4; 328/109, 112, 154, 116; 361/154, 187, 86

[56] References Cited

U.S. PATENT DOCUMENTS

| | | | |
|---|---|---|---|
| 4,099,073 | 7/1978 | Hashimoto et al. | 307/296.5 |
| 4,151,425 | 4/1979 | Cappa | 307/130 |
| 4,176,289 | 11/1979 | Leach et al. | 307/270 |
| 4,188,547 | 2/1980 | Fox | 307/270 |
| 4,259,600 | 3/1981 | Fellrath et al. | 307/270 |
| 4,389,108 | 6/1983 | Ohtsubo et al. | 354/50 |
| 4,417,158 | 11/1983 | Ito et al. | 307/262 |
| 4,420,695 | 12/1983 | Fisher | 307/510 |
| 4,437,172 | 3/1984 | Masuoka | 365/182 |
| 4,441,136 | 4/1984 | Hampshire | 361/88 |
| 4,547,684 | 10/1985 | Pechar | 307/269 |
| 4,837,505 | 6/1989 | Mitsunobu | 307/242 |

Primary Examiner—Stanley D. Miller
Assistant Examiner—Trong Phan
Attorney, Agent, or Firm—Steven Caserza; Lee Patch

[57] ABSTRACT

A novel voltage selection circuit in which only one of a plurality of voltage levels is selected for application to an output node at any given time. Switching transistors are connected between the output node and associated reference voltages. Switching transistors are controlled by a set of voltage selection signals, each having logical zero and logical one states which are of sufficient magnitude to cause said switching transistors to turn on or turn off, and which are insured to be nonoverlapping. Two of the voltages are ground and VCC, which are switched by associated transistors using voltage selection signals having standard levels, such as ground and VCC. Another voltage VPPP is greater than VCC, and is switched by a switching transistor utilizing a voltage selection signal greater than VCC, preferably equal to VPPP. The wells of the second and third switching transistors are connected in common to VPPP to prevent junction breakdown when VPPP is selected. A novel selection circuit is used to provide nonoverlapping voltage selection signals in response to a plurality of control signals indicative of which voltage supply is to be selected at any given time.

5 Claims, 2 Drawing Sheets

SELECTING ONE OF A PLURALITY OF VOLTAGES WITHOUT OVERLAP

INTRODUCTION

Background

This invention pertains to voltage or power supply selection circuitry. It is particularly well suited for use within integrated circuits where one of a plurality of voltage levels is to be selected for application to a particular node, while ensuring that there is no overlap which would detrimentally cause more than one of the voltages to be selected and applied to the node at any given time.

Electronic circuits for switching voltages are well known in the prior art. A typical MOS semiconductor memory device is described in U.S. Pat. No. 4,437,172, including means for switching appropriate operating voltages to desired points within the memory device. U.S. Pat. No. 4,099,073 describes a four level voltage supply circuit for use in a liquid crystal display. U.S. Pat. No. 4,176,289 describes a driving circuit for a semiconductor memory including capacitors which are charged and then switched in order to provide an increased voltage level.

It is also desired to ensure that there is no overlap during the voltage selection process, i.e. that more than one of the plurality of power supplies be connected to the output node at any given time. This is particularly likely to occur during periods in which the voltage selection changes. FIG. 1 depicts a well known RS flip-flop circuit formed of two cross-coupled two input lead NOR gates. The RS flip-flop of FIG. 1 has two input terminals for receiving input signals $\overline{I1}$ and $\overline{I2}$ and Q and $\overline{Q}$ output terminals. As shown in Table 1, when either one of input signals I1 and $\overline{I2}$ are active (logical 0), only one of the Q and Q output signals are active (logical 1), a stable state. When neither input signals $\overline{I1}$ and $\overline{I2}$ are active, neither the Q or $\overline{Q}$ output signals are active. The overlap situation occurs when both input signals $\overline{I1}$ and $\overline{I2}$ are active (logical 0). In this event, the prior art flip flop circuit of FIG. 1 serves to cause only one of the Q or $\overline{Q}$ output signals to be active at any given time, thereby preventing overlap of the output signals where both the Q and $\overline{Q}$ output signals would be active at the same time.

TABLE 1

| $\overline{I1}$ | $\overline{I2}$ | Q | $\overline{Q}$ |
|---|---|---|---|
|   |   | 0 | 1 |
| 0 | 0 | 1 | 0 |
| 0 | 1 | 1 | 0 |
| 1 | 0 | 0 | 1 |
| 1 | 1 | 0 | 0 |

Cross-coupled flip flops similar to FIG. 1 are also known in the prior art having more than one set and/or more than one reset input terminal However, they continue to have only one set of complementary output signals Q and $\overline{Q}$, as does the prior art circuit of FIG. 1. Thus, such prior art multiple set and multiple reset cross-coupled flip flops can be thought of as a logic gate combining a plurality of set signals to provide the $\overline{I1}$ reset signal to the prior art flip flop of FIG. 1, and a logical gate combining a plurality of signals to provide the single $\overline{I2}$ set signal for use in the flip flop of FIG. 1. U.S. Pat. No. 4,547,684 describes a clock generator producing two nonoverlapping clock signals from a signal input clock signal.

Accordingly, there remains the need for a simple yet effective voltage selection circuit for applying a selected one of a plurality of voltages to an output lead while insuring no overlap during the selection process.

SUMMARY OF THE INVENTION

In accordance with the teachings of this invention, a novel voltage selection circuit is provided in which only one of a plurality of voltage levels is selected for application to an output node at any given time. In accordance with the teachings of this invention, a plurality of switching transistors are connected between the output node and an associated one of a plurality of reference voltages. Switching transistors are controlled by an associated set of voltage selection signals, each having logical zero and logical one states which are of sufficient magnitude to cause said switching transistors to turn on or turn off, as desired, and which are insured to be nonoverlapping. In one embodiment of this invention, one of the plurality of voltages is ground, which is switched by the transistor using a voltage selection signal having standard levels, such as ground and VCC. Another one of the plurality of voltages is VCC which is switched by a second switching transistor. A third voltage VPPP is greater than VCC, and is switched by a third switching transistor utilizing a voltage selection signal which is greater than VCC, preferably equal to VPPP. In this embodiment, the wells of the second and third switching transistors are connected in common to VPPP in order to prevent junction breakdown when VPPP is selected on the output node. Accordingly, both the second and third switching transistors are controlled by voltage selection signals equal to VPPP or ground and which are sufficient to cause the second and third transistors to switch properly given the fact that their wells are tied to a relatively high voltage, VPPP.

In one embodiment of this invention, a novel selection circuit is used to provide nonoverlapping voltage selection signals in response to a plurality of control signals indicative of which voltage supply is to be selected at any given time. Since these control signals are provided by external circuitry which may lie at some distance from the voltage selection circuitry, and which pass through different logical paths and thus have different propagation delays associated therewith, it cannot be guaranteed that these control signals will be nonoverlapping. Accordingly, the overlap protection circuit serves to guarantee that only one voltage selection signal is applied to the voltage selection circuit at any given time so that only one voltage supply is selected and connected to the output node at any given time.

In one embodiment of this invention, the overlap protection circuit comprises a plurality N logic gates, each having a plurality of N input leads. One input lead of each logic gate is connected to an associated one of the N control signal input leads, and each logic gate provides as an output signal an associated voltage selection signal. The other N-1 input leads of each of the N logic gates are connected to the output leads of each of the other logic gates. In this manner, should an overlap occur between the input control signals, there will not be an overlap in the selection of the supply voltages which are connected to the output node.

DETAILED DESCRIPTION

Figure 1:
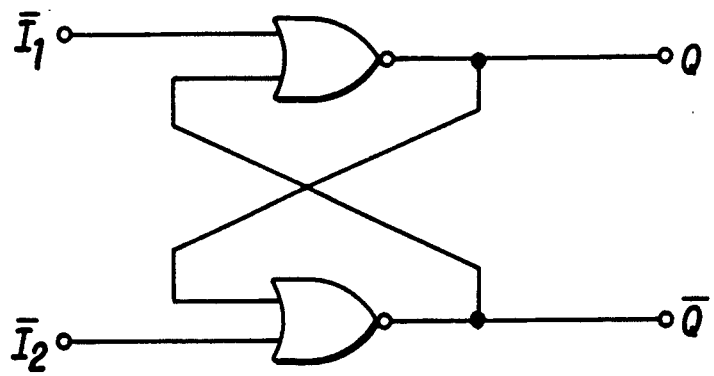
FIG. 1 is a schematic diagram of a typical prior art cross coupled NOR gate latch.
Figure 2:
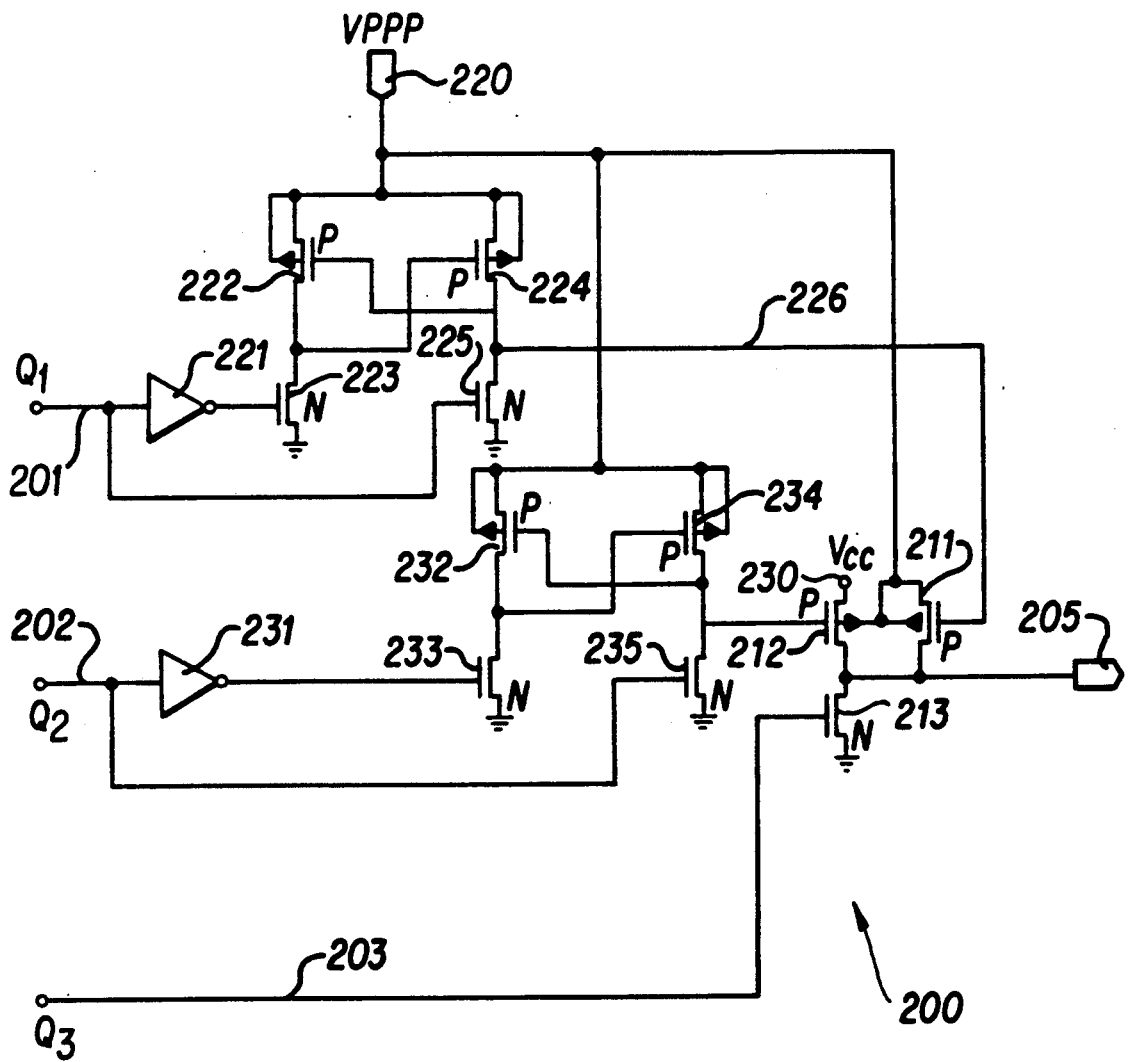
FIG. 2 is a schematic diagram of one embodiment of a voltage selection circuit constructed in accordance with the teachings of this invention.

FIG. 2 is a schematic diagram of one embodiment of a voltage selection circuit 200 constructed in accordance with the teachings of this invention. Voltage selection circuit 200 receives voltage selection signals Q1, Q2, and Q3 on input leads 201, 202, and 203, respectively. In response to an active (logical 1) Q1 signal, voltage selection circuit 200 applies voltage VPPP received on input terminal 220 to output terminal 205 via switching transistor 211. In this embodiment VPPP is a positive voltage (typically about 13 volts) greater than VCC (typically approximately 5 volts) and may comprise a pumped voltage useful during the programming and erasure of EPROM or E2PROM devices, as is well known to those of ordinary skill in the art.

Similarly, in response to an active Q2 voltage selection signal received on input lead 202, voltage selection circuit 200 applies VCC from terminal 230 to output terminal 205 through switching transistor 212. Likewise, when voltage selection signal Q3 is active, ground is connected to output terminal 205 via switching transistor 213.

With a logical one Q1 voltage selection signal applied to input lead 201, N channel pull down transistor 225 is turned on, connecting the gate of P channel switching transistor 211 to ground, thereby turning on switching transistor 211 and applying VPPP to output terminal 205. Simultaneously, a logical 0 output signal from inverter 221 is applied to the gate of N channel transistor 223 turning it off. This in turn causes P channel transistor 224 to turn off, ensuring lead 226 remains low, as desired. The low on lead 226 is applied to the gate of P channel transistor 222, turning it on and ensuring P channel transistor 224 is off. The cross-coupled arrangement of transistors 222 and 224 insures that transistor 224 is turned on in response to a logical 0 Q1 voltage selection signal and is turned off in response to a logical 1 Q1 voltage selection signal, and transistor 222 is turned off in response to a logical 0 Q1 voltage selection signal and is turned on in response to a logical 1 Q1 voltage selection signal. This action prevents current from flowing from VPPP to ground through transistors 222 and 223 or transistors 224 and 225, while providing a voltage translation from the Q1 signal level to the VPPP signal level on lead 226. The well of switching transistor 211 and the wells of transistors 222 and 224 are connected to VPPP, in order to supply a sufficiently high well voltage to prevent junction breakdown of switching transistor 211.

Conversely, with a logical zero Q1 voltage selection signal applied to input lead 201, N channel pull down transistor 225 is turned off. Simultaneously, a logical one output signal from inverter 221 is applied to the gate of N channel transistor 223, turning it on, connecting the gate of P channel transistor 224 to ground. This in turn causes P channel transistor 224 to turn on, pulling lead 226 high, turning off switching transistor 211 so VPPP is not provided to output terminal 205. The high on lead 226 is applied to the gate of P channel transistor 222, turning it off and ensuring P channel transistor 224 is on.

The subcircuit formed by inverter 231, P channel transistors 232 and 234, and N channel transistors 233 and 235, operates in a similar fashion to control the operation of P channel switching transistor 212 in response to the Q2 voltage selection signal. However, switching transistor 212 serves to selectively apply VCC from terminal 230 to output terminal 205. Of importance, the well of switching transistor 212 is connected to VPPP, as are the wells of transistors 232 and 234. This is necessary in order to prevent junction breakdown of switching transistor 212 which would occur when VPPP is applied to output terminal 205 through switching transistor 211 if the well of switching transistor 212 were connected to a voltage less than VPPP. Therefore, since the well of switching transistor 212 is connected to VPPP, and since node 205 may be connected via transistor 211 to VPPP, the gate voltage of transistor 212 must be significantly higher than VCC in order to turn off switching transistor 212. Hence the need for applying VPPP to the gate of switching transistor 212 through P channel transistor 234 when switching transistor 212 is to turn off, rather than a more typical voltage such as VCC.

In a similar, yet perhaps simpler manner, N channel switching transistor 213 serves as a pull down transistor to pull output terminal 205 to ground in response to a logical one Q3 voltage selection signal applied to input lead 203. Since the drain of N channel transistor 213 is connected to ground, it has a threshold voltage of approximately 0.7 volts and is easily driven by standard voltage levels, such as VCC. The bulk connection of N channel transistor 213 is conveniently formed as the substrate of the integrated circuit.

Of importance, it is important to insure that only one of switching transistors 211, 212, and 213 is turned on at any given time, in order to prevent voltages VCC, VPPP, and ground from being shorted together.

Naturally, it will be readily appreciated by those of ordinary skill in the art in light of the teachings of this invention that any number of voltages can be selected in accordance with the teachings of this invention utilizing the appropriate voltage selection subcircuitry for each voltage.

Figure 3:
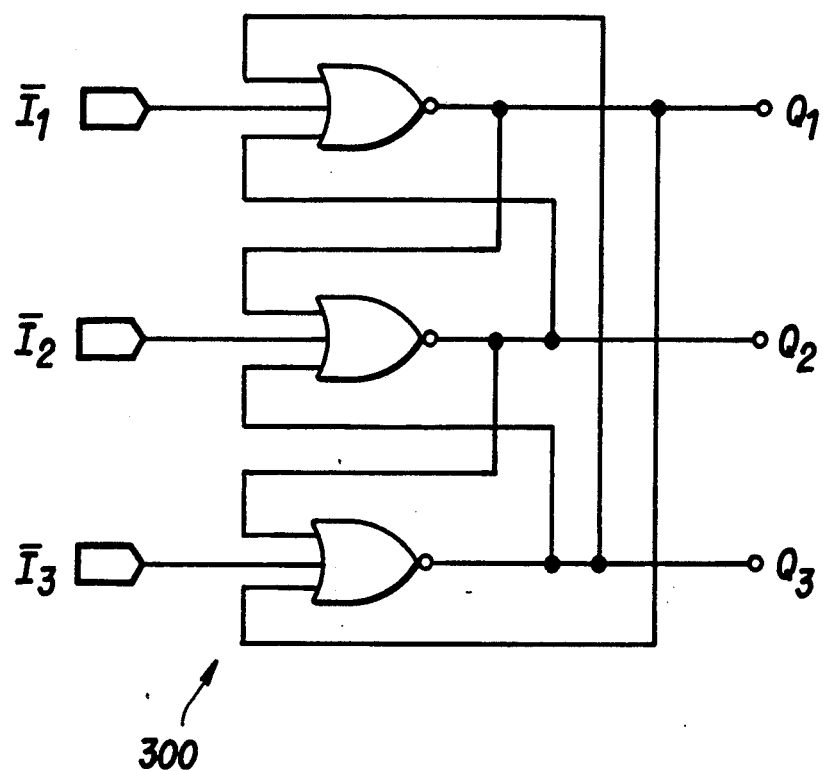
FIG. 3 is a schematic diagram of one embodiment of an overlap protection circuit constructed in accordance with the teachings of this invention.

FIG. 3 depicts one embodiment of a nonoverlap circuit constructed in accordance with the teachings of this invention. Circuit 300 of FIG. 3 receives a plurality of control signals $\overline{I1}$, $\overline{I2}$, and $\overline{I3}$ which define which of the desired voltages is to be selected. Circuit 300 provides nonoverlapping voltage selection signals Q1, Q2, and Q3 in response to control signals $\overline{I1}$, $\overline{I2}$, and $\overline{I3}$. As shown in the embodiment of FIG. 3, overlap protection circuit 300 comprises a plurality of three logic gates, each having three input leads. One input lead of each logic gate receives an associated 1 of the control signals $\overline{I1}$, $\overline{I2}$, and $\overline{I3}$. The other input leads of each logic gate are connected to the output leads of the other logic gates. The output lead of each logic gate provides as an output signal voltage selection signals Q1, Q2, and Q3 which are related to control signals $\overline{I1}$, $\overline{I2}$, and $\overline{I3}$, respectively, but which are nonoverlapping. In this manner, should an overlap occur between the input control signals $\overline{I1}$, $\overline{I2}$, and $\overline{I3}$, there will not be an overlap in the voltage selection signals Q1, Q2, and Q3, thereby preventing an overlap of the voltage selection. The operation of the embodiment of FIG. 3 is depicted in Table 2.

TABLE 2

|  | $\overline{I1}$ | $\overline{I2}$ | $\overline{I3}$ | Q1 | Q2 | Q3 |
|---|---|---|---|---|---|---|
| (1) overlap | 0 | 0 | 0 | 0 | 0 | 1 |
|  |  |  |  | 0 | 1 | 0 |
|  |  |  |  | 1 | 0 | 0 |
| (2) overlap | 0 | 0 | 1 | 1 | 0 | 0 |
|  |  |  |  | 0 | 1 | 0 |
| (3) overlap | 0 | 1 | 0 | 1 | 0 | 0 |
|  |  |  |  | 0 | 0 | 1 |
| (4) nonoverlap | 0 | 1 | 1 | 1 | 0 | 0 |
| (5) overlap | 1 | 0 | 0 | 0 | 1 | 0 |
|  |  |  |  | 0 | 0 | 1 |
| (6) nonoverlap | 1 | 0 | 1 | 0 | 1 | 0 |
| (7) nonoverlap | 1 | 1 | 0 | 0 | 0 | 1 |
| (8) no selection | 1 | 1 | 1 | 0 | 0 | 0 |

For the three nonoverlap cases 4, 6, and 7, where only a single one of the input control signals $\overline{I1}$, $\overline{I2}$, and $\overline{I3}$ is active, there is no overlap in the voltage selection signals Q1, Q2, and Q3, with any active voltage selection signal being the voltage selection signal corresponding to the active input control signal $\overline{I1}$, $\overline{I2}$, and $\overline{I3}$. Case 8, in which all input control signals $\overline{I1}$, $\overline{I2}$, and $\overline{I3}$ are inactive, requires no selection of voltages and thus all voltage selection signals Q1, Q2, and Q3 are inactive. For cases 2, 3, and 5, in which there is an overlap in the input control signals such that two of the input control signals $\overline{I1}$, $\overline{I2}$, and $\overline{I3}$ are active simultaneously, there is no overlap in the voltage selection signals Q1, Q2, and Q3. For each of the overlap cases 2, 3 and 5, there are two possible sets of voltage selection signals Q1, Q2, and Q3, wherein only one voltage selection signal is active at any given time. For the overlap situation of case 1, in which all three input control signals $\overline{I1}$, $\overline{I2}$, and $\overline{I3}$ are active simultaneously, there are three sets of possible voltage selection signals Q1, Q2, and Q3, wherein for each set only a single one of the voltage selection signals is active at any given time.

Thus, in accordance with the embodiment of FIG. 3, a nonoverlap circuit is provided which assures that only a single output signal will be active at any given time, regardless of whether the input signals are overlapping or not. Naturally, it will be appreciated by those of ordinary skill in the art in light of the teachings of this invention that the embodiment of FIG. 3 is exemplary only, and can be expanded to any desired size wherein a plurality of N input control signals are received by a plurality of N logic gates, each having a plurality of N input leads, and which provide a plurality of N nonoverlapping output signals.

Figure 4:
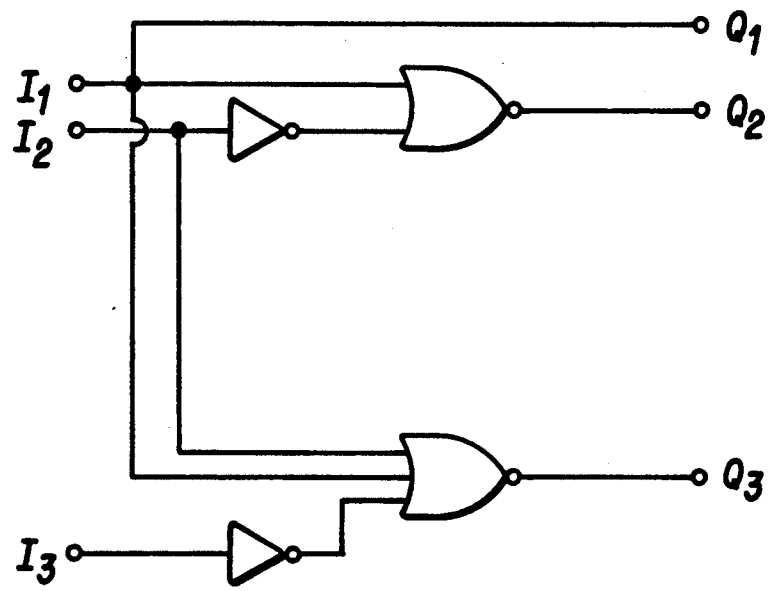
FIG. 4 is a schematic diagram of another embodiment of an overlap protection circuit constructed in accordance with the teachings of this invention.

FIG. 4 is a nonoverlap circuit constructed in accordance with another embodiment of this invention. In the embodiment of FIG. 4, input signals I1, I2, and I3 are active high, in contrast to the embodiment of FIG. 3 in which input signals are active low. The embodiment of FIG. 4 functions as a priority resolver, insuring that at most one of the output signals Q1, Q2, and Q3 are high at any given time.

Input signal I1 is given the highest priority. If I1 is a logical one, then output signal Q1 is a logical one and output signals Q2 and Q3 are logical zero, regardless of the states of input signals I2 and I3. Input signal I2 is given the second highest priority. If I1 is a logical zero and $\overline{I2}$ is a logical one, then output Q2 is a logical one (and outputs Q1 and Q3 are logical zeros) regardless of the state of input I3. Input I3 is given the lowest priority. Only if inputs I1 and I2 are logical zeros and input I3 is a logical 1 will output Q3 be a logical one (and outputs Q1 and Q2 are logical zeros). This operation is described in the following truth table:

TABLE 3

| I1 | I2 | I3 | Q1 | Q2 | Q3 |
|---|---|---|---|---|---|
| 0 | 0 | 0 | 0 | 0 | 0 |
| 0 | 0 | 1 | 0 | 0 | 1 |
| 0 | 1 | 0 | 0 | 1 | 0 |
| 0 | 1 | 1 | 0 | 1 | 0 |
| 1 | 0 | 0 | 1 | 0 | 0 |
| 1 | 0 | 1 | 1 | 0 | 0 |
| 1 | 1 | 0 | 1 | 0 | 0 |
| 1 | 1 | 1 | 1 | 0 | 0 |

The circuit functions as a priority resolver, guaranteeing that, at most, one Q output is active.

$I_1$ is given the highest priority. If $I_1 = 1$ then $Q1 = 1$ and $Q2 = Q3 = 0$, no matter what $I_2$ or $I_3$ are equal to.

$I_2$ is given 2nd priority. If $I_1 = 0$ and $I_2 = 1$, then $Q2 = 1$ no matter what I3 is equal to.

I3 is given the lowest priority. Only if $I1 = I2 = 0$ and if $I3 = 1$, then $Q3 = 1$.

If $I1 = I2 = I3 = 0$, then $Q1 = Q2 = Q3 = 0$.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed:

1. A voltage selection circuit comprising:
   a plurality of N voltage terminals, where N is greater than two, each receiving an associated one of a plurality of N voltages, of which there are at least three different voltage levels, said voltage levels comprising a first voltage corresponding to a logical zero, a second voltage corresponding to a logical one, and at least one voltage greater than said second voltage;
   an output terminal for providing an output voltage selected from one of said plurality of N voltages;
   a plurality of N switch means, each switch means being associated with one of said N voltages, each switch means comprising:
      a first terminal coupled to an associated one of said N voltage terminals;
      a second terminal coupled to said output terminal; and
      a control terminal for receiving a voltage selection signal associated with said associated one of said N voltages, said voltage selection signal capable of having a level equal to either said first voltage or said second voltage; and
   a plurality of N control means for providing a plurality of N sets of voltage levels, each being associated with one of said switch means, each control means comprising:
      an input lead for receiving an associated one of said N voltage selection signals;

an output lead coupled to said control terminal of said associated switch means; and means for providing an output signal on said output terminal in response to said associated one of said N voltage selection signals, said output signal being non-overlapping with the output signals of all other of said plurality of N control means, said output signal having a first state of a sufficient magnitude to cause said associated one of said switch means to turn on, and having a second state of sufficient magnitude to cause said associated one of said switch means to turn off.

2. A circuit as in claim 1 wherein said N switch means each comprise an FET having a source, a drain, and having a well region connected to a voltage sufficiently high to prevent breakdown between said source and said well region and between said drain and said well region regardless of which of said N voltages is connected to said output terminal.

3. A circuit as in claim 2 wherein said well region of selected ones of said FETs are coupled to the one of said N voltages having the greatest magnitude of said N voltages.

4. A non-overlap circuit comprising:

a plurality of N input leads for receiving a plurality of N input signals each having an active state which may overlap with the active states of one or more others of said N input signals, where N is an integer greater than two, and where said N input signals provide at least three voltage levels, said voltage levels comprising a first voltage corresponding to a logical zero, a second voltage corresponding to a logical one, and at least one voltage greater than said second voltage;

a plurality of N output leads for providing a plurality of N non-overlapping output signals, each being associated with an associated one of said input signals;

means responsive to said N input signals for causing each of said output signals to be active in response to its associated input signal being active when said input signals are non-overlapping; and means responsive to said N input signals for preventing more than one of said output signals from being active when more than one of said input signals are active.

5. A non-overlap circuit comprising:

a plurality of N input leads for receiving a plurality of N input signals each having an active state which may overlap with the active states of one or more others of said N input signals, where N is an integer greater than two;

a plurality of N output leads for providing a plurality of N non-overlapping output signals, each being associated with an associated one of said input signals; and a plurality of N logic gates, each comprising:

a plurality of N input leads, a selected one of said input leads being coupled to an associated one of said N input leads; and an output lead being coupled to an associated one of said output leads and being uniquely coupled to one of said input leads of each of the other of said N logic gates.

* * * * *